United States Patent [19]
Twitchell

[11] Patent Number: 5,917,373
[45] Date of Patent: Jun. 29, 1999

[54] APPARATUS WITH REDUCED A/D DYNAMIC RANGE REQUIREMENT IN A COMPENSATING FEEDBACK SYSTEM

[75] Inventor: Edwin Ray Twitchell, Quincy, Ill.

[73] Assignee: Harris Corporation, Melbourne, Fla.

[21] Appl. No.: 08/885,373

[22] Filed: Jun. 30, 1997

[51] Int. Cl.⁶ ...................................................... H03F 1/26
[52] U.S. Cl. .......................................... 330/149; 375/296
[58] Field of Search ..................................... 330/107, 129, 330/149; 332/107, 123, 159; 455/126; 375/296, 297

[56] References Cited

U.S. PATENT DOCUMENTS

| | | | |
|---|---|---|---|
| 4,985,688 | 1/1991 | Nagata | 332/123 |
| 5,093,637 | 3/1992 | Isota et al. | 332/103 |
| 5,339,054 | 8/1994 | Taguchi | 332/100 |
| 5,404,378 | 4/1995 | Kimura | 375/296 |
| 5,486,789 | 1/1996 | Palandech et al. | 330/149 |

*Primary Examiner*—Steven J. Mottola
*Attorney, Agent, or Firm*—Tarolli, Sundheim, Covell, Tummino & Szabo

[57] ABSTRACT

An apparatus for compensating signal distortion via use of a feedback path, with reduced analog to digital conversion capacity requirements. In one embodiment, the apparatus is part of a transmission system which has an analog amplifier that distorts an information signal. Prior to the amplification, the information signal is provided in a digital format, processed digitally, and converted to analog for input to the amplifier. A sample signal is coupled off of output of the amplifier and applied along the feedback path. An analog-to-digital converter is located along the feedback path. A pre-distortion corrector is at the end of the feedback path. The pre-distortion corrector operates upon the source information using feedback data indicative of the amplifier distortion. Specifically, the information signal is pre-distorted (prior to input to the amplifier) to compensate for the distortion of the amplifier. A summation device is located along the feedback path, upstream of the analog-to-digital converter, to remove a source-based portion from the sample signal and for providing the sample signal containing only the amplifier distortion portion to the converter for conversion to digital.

7 Claims, 1 Drawing Sheet

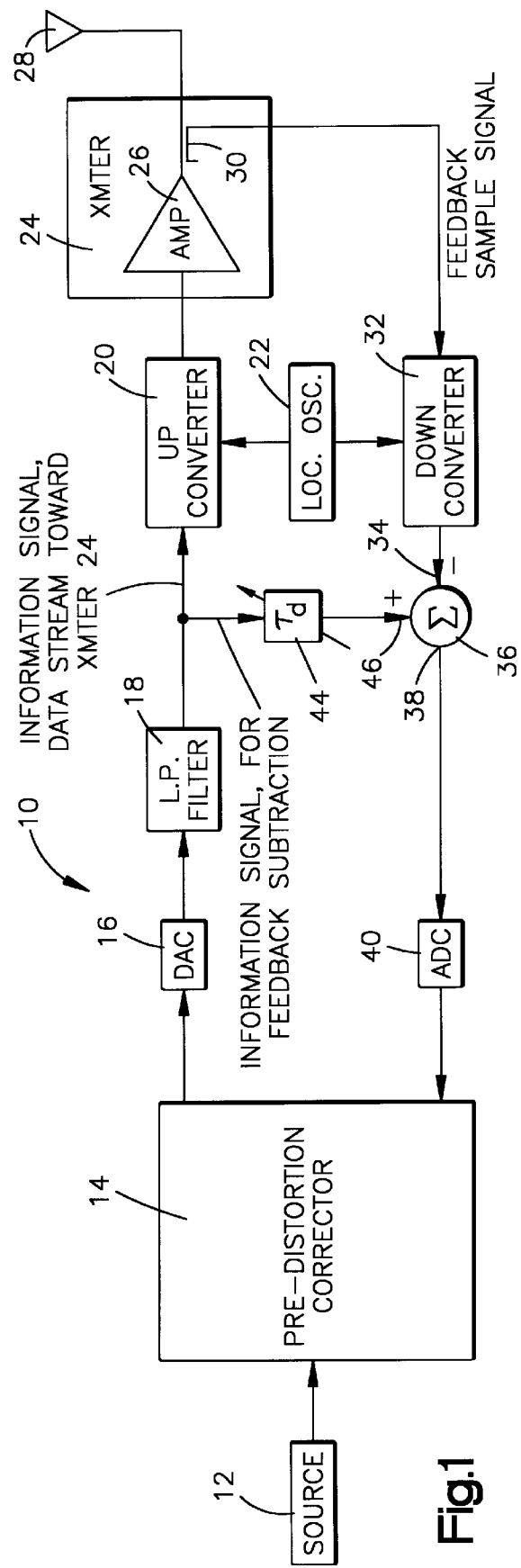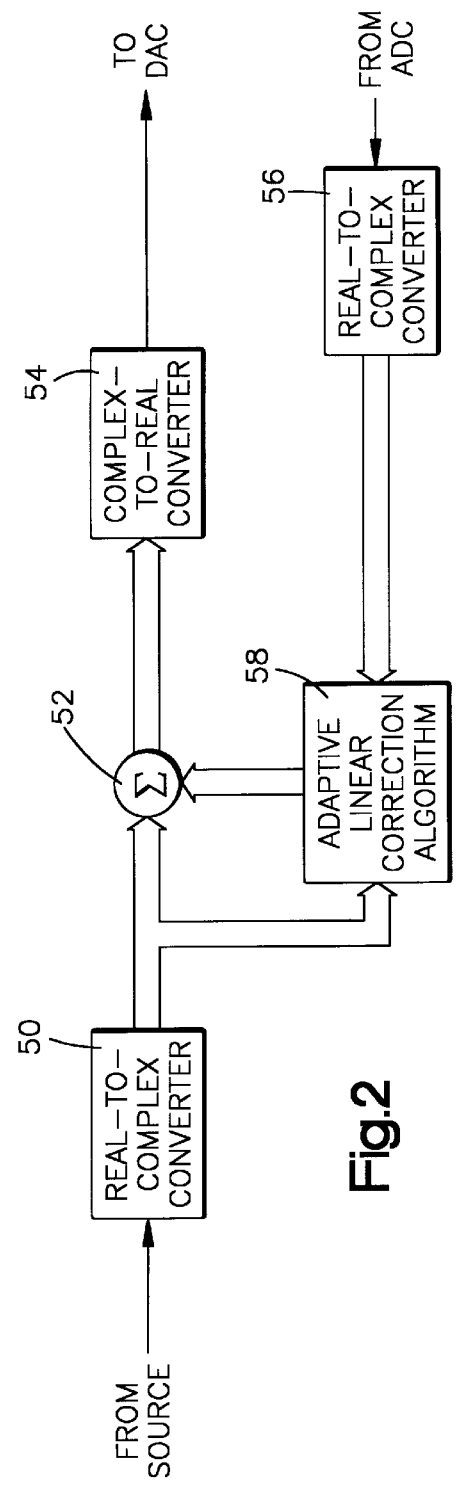

APPARATUS WITH REDUCED A/D DYNAMIC RANGE REQUIREMENT IN A COMPENSATING FEEDBACK SYSTEM

TECHNICAL FIELD

The present invention is generally directed to a data transfer system and is particularly directed to a feedback portion of the system used to correct distortion generated within an amplifier.

BACKGROUND OF THE INVENTION

Various data communication system require amplification of the information signal. Typically, the information data stream is created or provided in a digital format and is converted to an analog signal. The analog signal is then provided as an input to a high-power amplifier. The amplifier distorts the signal.

One method of correcting the distorting effect of the amplifier is to pre-distort the signal prior to supplying the signal as an input to the amplifier. In order to pre-distort the signal, the output of the amplifier is sampled to determine whether the pre-distortion of the signal accurately compensates for the distorting effect of the amplifier and, if necessary, to adjust the pre-distortion in order to improve the compensation. A feedback line is coupled off from the amplifier out for carrying a sample along a feedback path.

At the end of the feedback path is a device for making the determinations and adjustments regarding the pre-distortion. The determination/adjustment device operates is a digital format. Accordingly, the feedback sample signal is converted from an analog format (as occurs at the output of the amplifier) to a digital format. An analog-to-digital converter is located along the feedback path to accomplish the conversion. The analog-to-digital converter must have a sufficiently large bandwidth and dynamic range to accommodate the signal input to the analog-to-digital converter such that data is not lost.

SUMMARY OF THE INVENTION

The present invention provides an apparatus for compensating distortion generated in an amplifier of a data transfer system. The system provides a digital sourcebased signal, which contains source information data. The system converts the source-based signal from digital to analog for input to the amplifier. The amplifier provides an analog output signal containing a source-based portion and an amplifier distortion portion. The apparatus includes sampler means for sampling the output signal of the amplifier and for supplying a sample signal indicative of the output signal along a feedback path.

Converter means, located along the feedback path, converts an inputted signal from analog to digital. Corrector means, at the end of the feedback path, operates upon the source information using feedback data indicative of the amplifier distortion portion of the amplifier output signal. Remover means, located along the feedback path upstream of the converter means, removes the source-based portion from the sample signal and provides the sample signal containing only the amplifier distortion portion to the converter means for conversion to digital.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein:

FIG. 1 is a schematic illustration of an apparatus in accordance with the present invention; and FIG. 2 is a schematic illustration of an example device for pre-distorting an information signal within the apparatus shown in FIG. 1.

DESCRIPTION OF A PREFERRED EMBODIMENT

One representation of the present invention is schematically shown in FIG. 1 as an apparatus 10 for compensating signal distortion via use of a feedback path, with reduced analog to digital conversion capacity requirements. An information signal is provided, in digital format, from a data signal source 12 to the apparatus 10. The source 12 may be any suitable source, such as a portion of a high definition television (HDTV) transmitter system.

HDTV systems have large data rates, and have high error prevention/eradicating measures. In a preferred embodiment, the apparatus 10 according to the present invention is part of a solution directed to the error prevention/eradicating measures within a HDTV system. Hereinafter, where appropriate, the apparatus 10 is discussed in the environment of a HDTV system to help illustrate the present invention.

Within the apparatus 10, the information signal from the source 12 is provided to a pre-distortion corrector 14. The pre-distortion corrector 14 operates to pre-distort the information signal for purposes which are described below. The pre-distorted information signal is provided to a digital-to-analog converter (DAC) 16 for conversion to analog format. The, now analog, pre-distorted information signal is passed through a low-pass filter 18 to remove alias components.

The information signal (analog, filtered, pre-distorted) is up converted by an up converter 20, which is driven by a local oscillator 22. After up-conversion, the information signal (up-converted, analog, etc.) is provided to a transmitter 24 of the HDTV system. Within the transmitter 24, a high-power amplifier 26 amplifies the information signal and provides the amplified signal to an antenna 28 for broadcast transmission therefrom.

As an unwanted effect resulting from the information signal amplification process within the amplifier 26, the signal is distorted by the amplifier 26. The pre-distortion of the information signal by the pre-distortion corrector 14 compensates for the distortion caused by the amplifier 26. In order to determine the pre-distortion which should be imposed onto the information signal, and to monitor the effectiveness of the pre-distortion, an analog sample signal is coupled off by a device 30 at the output of the amplifier 26 and provided onto a line defining the feedback path.

Along the feedback path, the sample signal is down converted by a down converter 32, which is driven by the same local oscillator 22 driving the up converter 20. At this point along the feedback path (i.e., the output of the down converter 32) the feedback sample signal is analog, and contains a pre-distorted information portion and an amplifier-caused distortion portion. The output of the down converter 32 is connected to a first input 34 of a summation device 36. The first input 34 is a subtracting input and, the feedback sample signal is provided as a negative quantity to a summing function within the summation device 36.

Continuing along the feedback path, the output 38 of the summation device 36 is provided to an analog-to-digital converter (ADC) 40 which converts an inputted signal to digital format. The output of the analog-to-digital converter 40 is a digital format signal which is supplied to the pre-distortion corrector 14. Within the pre-distortion corrector 14, the digital format signal provided by the analog-to-digital converter 40 is analyzed to determine whether the amplifier-caused distortion is compensated.

It is to be appreciated that the pre-distortion corrector 14 of the apparatus is along a data stream. The pre-distortion of the subsequent incoming information signals from the source 12 is based upon determinations regarding compensation against amplifier-caused distortion of previous information signals (i.e., the effectiveness of the pre-distortion of the previous information signals).

Systems, such as the HDTV system, which have a relatively large data bit rate must have components which can handle the bit rate. Specifically, in order to effectively adapt to the distortion caused by the amplifier 26, the analog-to-digital converter 40 must be able to accommodate the bandwidth and dynamic range for the signal input thereto.

In order to reduce the bandwidth and range requirements for the analog-to-digital converter 40, the summation device 36 operates to remove the pre-distorted information portion of the feedback sample signal. Specifically, a variable delay device 44 is connected between the output of the low-pass filter 18 (i.e., coupled-off from the data stream) and a positive, second input 46 of the summation device 36, such that the information signal is provided to the second input of the summation device. The delay device 44 "holds" the information signal for a period of time before the delay device provides the information signal to the summation device 36.

The time delay imposed upon the information signal is such that the signal provided at the second, positive input 46 of the summation device 36 is in "sync" with the feedback sample signal provided at the first, subtracting input 34 of the summation device, with regard to the information portion contained within the two provided signals. Specifically, the feedback sample signal provided to the summation device 36 is the amplifier-distorted version of the information signal which is simultaneously provided to the summation device. The time delay imposed by the delay device 44 is variable to accommodate time variations in the up-conversion, amplification, and down-conversion processes.

Within the summation device 36, the two inputs are "added" (i.e., the "negative quantity" sample signal is added to the information signal). Accordingly, the source data portion is removed from the sample signal and the remaining portion of the sample signal (i.e., the portion containing the distortion caused by the amplifier 26) is provided at the output 38. In the illustrated embodiment, the remaining portion signal provided at the output 38 is a negative quantity. Providing the output 38 as a negative quantity is useful downstream in the pre-distortion corrector 14 (e.g., for comparison via subtraction). It will be appreciated that the a different type of summation device 36 could be used such that the information signal would be subtracted from the sample signal and the output 38 would have a positive quantity.

Within the present invention, only the distortion portion (caused by the amplifier 26) of the sample signal is converted to a digital format at the analog-to-digital converter 40. The need for the analog-to-digital converter 40 to have a bandwidth and dynamic range necessary to convert both the pre-distorted source data signal and the distortion caused by the amplifier 26 is obviated. Accordingly, the "size" of the analog-to-digital converter 40 is chosen to accommodate only the amplifier-caused distortion portion of the feedback sample signal, and analog-to-digital converter 40 does not have the additional capacity to handle conversion of the pre-distorted information portion of the feedback sample signal.

An example of the components within the pre-distortion corrector 14 is shown in FIG. 2. The example pre-distortion corrector 14 includes a real-to-complex converter 50, a summation device 52, and a complex-to-real converter 54 along the data stream. At the feedback path, the pre-distortion corrector 14 includes a real-to-complex converter 56 and an adaptive linear correction algorithm 58. The operations of the summation device 52 and the correction algorithm 58 are in the complex domain (I and Q).

The real-to-complex converter 50 provides a first input to the summation device 52, and also supplies the incoming information to the correction algorithm 58. Within the correction algorithm 58, the distortion caused by the amplifier 26 is analyzed and an appropriate correction value is provided. In one preferred embodiment of the correction algorithm 58, a look-up table is provided which contains correction values, and a correction value is selected from the table. The appropriate correction value is provided as a second input to the summation device 52. A corrected or pre-distorted information signal is output from the summation device 52.

From the above description of the invention, those skilled in the art will perceive improvements, changes and modifications. Such improvements, changes and modifications within the skill of the art are intended to be covered by the appended claims.

Having described the invention, the following is claimed:

1. An apparatus for compensating distortion generated in an amplifier of a data transfer system, the system providing a digital source-based signal, containing source information data, and converting the source-based signal from digital to analog for input to the amplifier located along an information signal stream, and the amplifier providing an analog output signal containing a source-based portion and an amplifier distortion portion, said apparatus comprising:

sampler means for sampling the output signal of the amplifier and for supplying a sample signal indicative of the output signal along a feedback path;

converter means, located along the feedback path, for converting an inputted signal from analog to digital;

corrector means, located upstream of the amplifier along the information signal stream and at the end of the feedback path, for operating upon the source information using feedback data indicative of the amplifier distortion portion of the amplifier output signal;

remover means, located along the feedback path upstream of said converter means, for removing the source-based portion from the sample signal and for providing the sample signal containing only the amplifier distortion portion to said converter means for conversion to digital, said remover means including a device that receives two inputs, the first input being the sample signal which contains the source-based portion and the amplifier distortion portion, the second input being the source-based signal, said device including means for subtracting one of the inputs from the other one of the inputs; and source-based signal provision means for providing the second input to said device, said source-based signal provision means including means coupled into the information signal stream upstream of the amplifier and downstream of said corrector means.

2. An apparatus as set forth in claim 1, wherein said source-based signal provision means includes delay means for time delaying the source-based signal for a period of time.

3. An apparatus as set forth in claim 2, wherein said delay means includes means for delaying the source-based signal such that the source-based signal provided as the second input of the device corresponds with the sample signal provided as the first input of the device with regard to the information portion contained within the two provided signals.

4. An apparatus as set forth in claim 3, wherein the sample signal provided as the first input of said device is the amplifier-distorted version of the source-based signal simultaneously provided as the second input of said device.

5. A distortion compensating apparatus in a transmission system, said system including an information signal source, an up converter, and a distorting amplifier located along an information data stream path, said apparatus comprising:

pre-distortion corrector means, located along the information data stream path downstream of said signal source and upstream of said up converter, for operating upon the information signal to pre-distort the information signal;

sampler means for sampling an output of said amplifier and for supplying a sample signal along a feedback path toward said corrector means, said sample signal at said sampler means comprising the information signal that has been pre-distorted by said corrector means, up converted by said up converter, and distorted by said amplifier;

a down converter located along the feedback path between said sampler means and said corrector means; and remover means, located along the feedback path between said sampler means and said corrector means, for removing a portion of said sample signal that is indicative of said pre-distorted information signal, said remover means including means for deriving said pre-distorted information signal at a point along the information data stream downstream of said corrector means.

6. An apparatus as set forth in claim 5, wherein said remover means is located between said down converter and said corrector means, and said means for deriving derives said pre-distorted information signal upstream of said up converter.

7. An apparatus as set forth in claim 6, wherein said means for deriving includes means for time delaying said pre-distorted information signal to compensate for processing time within said up converter, said amplifier, and said down converter.

* * * * *